(12) United States Patent
Lai et al.

(10) Patent No.: US 7,514,968 B1
(45) Date of Patent: Apr. 7, 2009

(54) H-TREE DRIVER CIRCUITRY

(75) Inventors: Tin H. Lai, San Jose, CA (US); Wilson Wong, San Francisco, CA (US); Sergey Shumarayev, Los Altos Hills, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 176 days.

(21) Appl. No.: 11/786,295

(22) Filed: Apr. 10, 2007

(51) Int. Cl.
*H03K 3/00* (2006.01)
(52) U.S. Cl. .......................... 327/108; 327/540; 326/83
(58) Field of Classification Search ................. 327/108, 327/540; 326/83
See application file for complete search history.

(56) References Cited

U.S. PATENT DOCUMENTS

| | | | | |
|---|---|---|---|---|
| 5,969,545 | A * | 10/1999 | Assadian et al. .............. 327/62 |
| 6,603,348 | B1 * | 8/2003 | Preuss et al. ................. 327/563 |
| 6,900,663 | B1 * | 5/2005 | Roper et al. ................... 326/83 |
| 7,038,502 | B2 * | 5/2006 | Yamaguchi ................. 327/108 |
| 7,053,712 | B2 * | 5/2006 | Bonaccio et al. ............ 330/258 |

OTHER PUBLICATIONS

B. Razavi, *Design of Analog CMOS Integrated Circuits*, McGraw-Hill, New York, 2001 § 5.2 "Cascode Current Mirrors," pp. 139-145.

* cited by examiner

*Primary Examiner*—Kenneth B. Wells
(74) *Attorney, Agent, or Firm*—Ropes & Gray LLP; Robert R. Jackson (57) ABSTRACT

An H-tree driver circuit has pull-up and pull-down current sources, each of which is implemented using a low-voltage-cascode topology.

15 Claims, 9 Drawing Sheets

H-TREE DRIVER CIRCUITRY

BACKGROUND OF THE INVENTION

This invention relates to driver circuitry, typically of the type that is used to drive a signal off of an integrated circuit device.

Driver circuits are typically used to drive signals such as data signals off an integrated circuit device. One type of driver circuit is known as an H-tree driver. A driver of this kind produces a pair of output signals that are logical complements of one another. Such a pair of output signals indicates a logical or data 1 or 0 by which of the signals in the pair has the higher voltage. Signalling of this type is known as differential signalling.

As integrated circuit ("IC") fabrication technology continues to advance, the circuit features on ICs become smaller and the voltage swings being used also become smaller. Signalling speeds are also becoming faster. For all of these reasons it is important to improve the performance of the output driver circuits used on ICs.

SUMMARY OF THE INVENTION

In accordance with the present invention, differential output driver circuitry may include a pull-up current source and a pull-down current source. Two pairs of transistors are connected in parallel between the pull-up and pull-down current sources. The transistors in each pair are connected in series with one another. A node between the transistors in each pair is a respective one of two (differential) output nodes of the circuit. A pair of resistors is connected in series between the two output nodes. A common mode voltage source is connected between the resistors. Each of the current sources preferably has a low-voltage cascode topology. Thus each current source may include two primary transistors connected in series to provide the actual current of the current source. In addition, each current source may include two secondary transistors connected in series with a reference current. In each thus-configured current source, gate terminals of one of the primary and secondary transistors are connected to one another and to a source terminal (pull-up circuit) or a drain terminal (pull-down circuit) of the other secondary transistor in the current source. In addition, in each thus-configured current source, gate terminals of the other of the primary and secondary transistors are connected to one another and to a bias voltage source.

The construction of the current source(s) improves the performance of the output driver in applications requiring lower voltages and despite the use of small IC fabrication "process nodes" (e.g., 6.5 nm rather 90 nm as a minimum channel length).

Further features of the invention, its nature and various advantages will be more apparent from the accompany drawings and the following detailed description.

DETAILED DESCRIPTION

Figure 1:
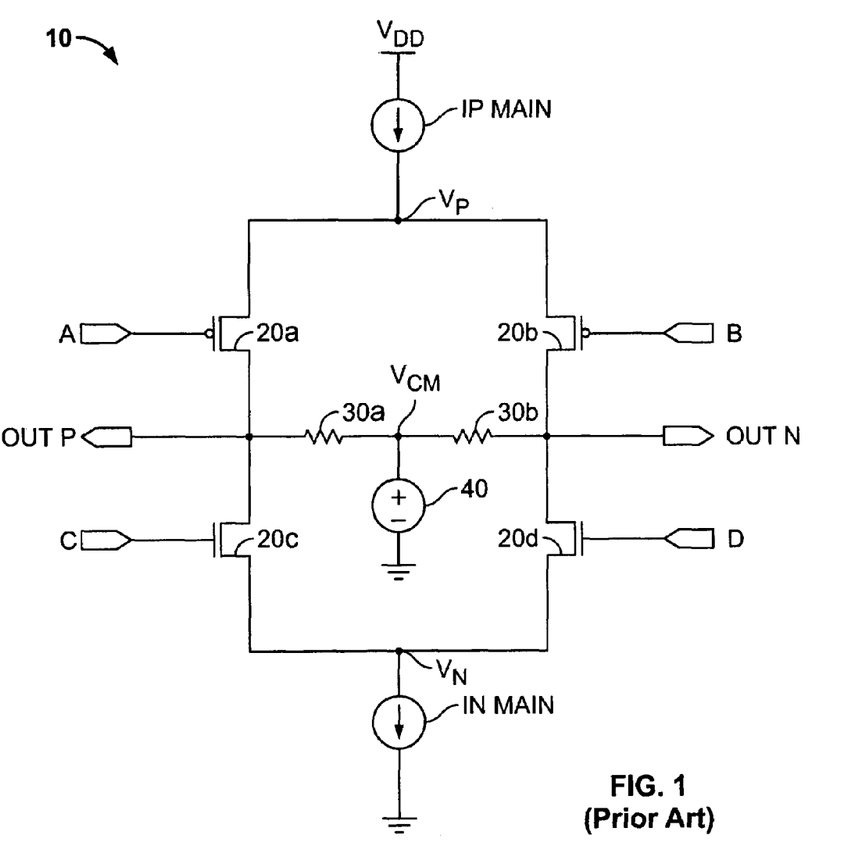
FIG. 1 is a simplified schematic block diagram of an illustrative known H-tree driver circuit.

FIG. 1 shows a conventional CMOS H-tree (class AB) differential output driver 10. Only one main tap is shown in FIG. 1 for simplicity. Driver 10 includes pull-up current driver IPMAIN connected in series between power supply voltage source VDD and node VP, pull-down current driver INMAIN connected in series between node VN and ground, PMOS transistor 20a and NMOS transistor 20c connected in series between nodes VP and VN, PMOS transistor 20b and NMOS transistor 20d connected in series between nodes VP and VN, output terminal OUTP connected between transistors 20a and 20c, output terminal OUTN connected between transistors 20b and 20d, resistors 30a and 30b connected in series between nodes OUTP and OUTN, common mode voltage node VCM connected between resistors 30a and 30b, and common mode driver 40 connected in series between node VCM and ground.

Assume that a "true" data output is when switches (transistors) 20a and 20d are conducting (inputs A and C low and inputs B and D high). The currents IPMAIN and INMAIN then flow through the following elements in series: IPMAIN, 20a, 30a, 30b, 20d, and INMAIN. The "complement" data output is when switches (transistors) 20b and 20c are conducting (inputs B and D low and inputs A and C high). The currents IPMAIN and INMAIN then flow through the following elements in series: IPMAIN, 20b, 30b, 30a, 20c, and INMAIN.

Figure 2:
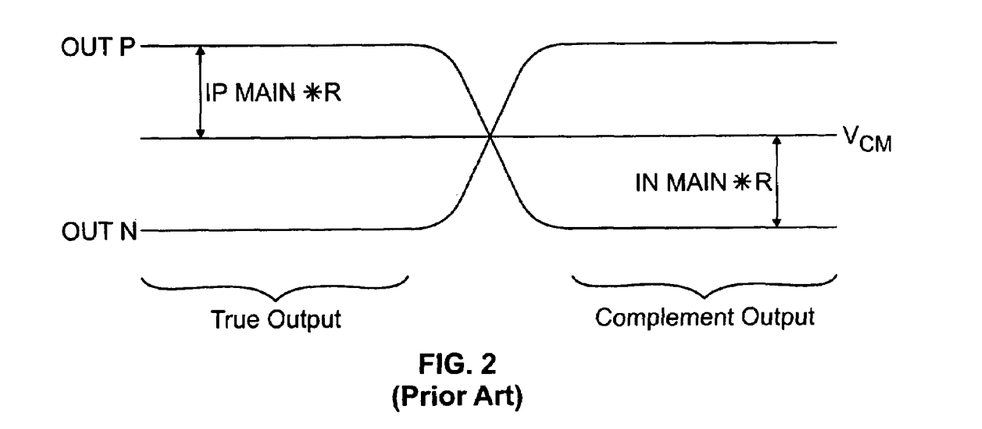
FIG. 2 is a simplified diagram of output signals of circuitry of the type shown in FIG. 1.

From the foregoing, it will be seen that each output OUTP and OUTN will either be at voltage IPMAIN*R above VCM, or at voltage INMAIN*R below VCM, depending on the output polarity (where R is the value of either of equal-valued resistors 30). This is shown in FIG. 2.

Figure 3:
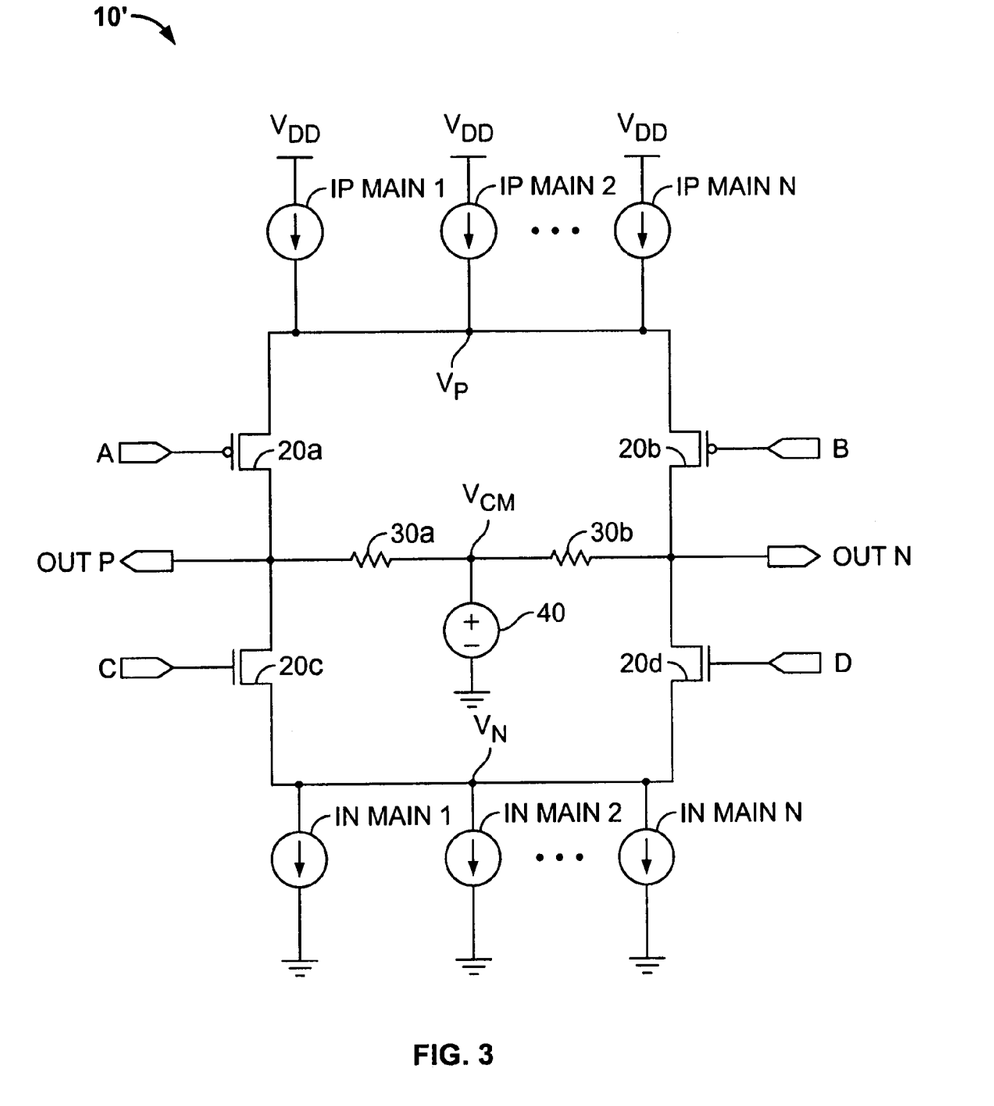
FIG. 3 is a simplified schematic block diagram showing possible augmentation of circuitry of the type shown in FIG. 1.

The output level VOUTP-VOUTN can be increased by increasing the pull-up/pull-down current amount, e.g., as shown in FIG. 3. The output driver 10' shown in FIG. 3 is similar to driver 10, except that in FIG. 3 the single pull-up current driver IPMAIN is replaced by several such drivers IPMAIN1, IPMAIN2, IPMAINN connected in parallel, and the single pull-down current driver INMAIN is replaced by several such drivers INMAIN1, INMAIN2, . . . , INMAINN connected in parallel.

Figure 4:
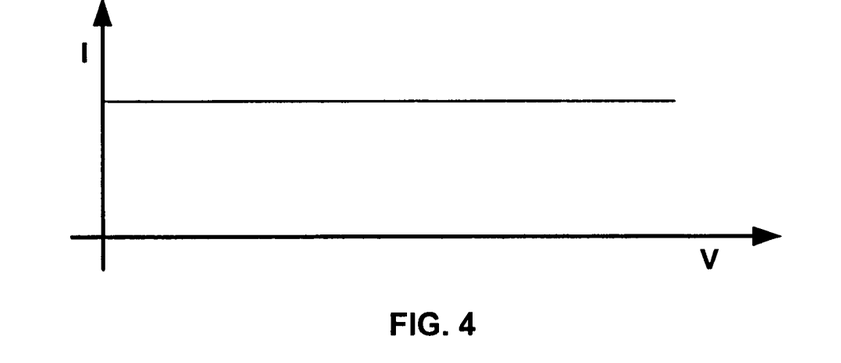
FIG. 4 is a simplified circuit performance diagram that is useful in explaining certain underlying principles.
Figure 5A:
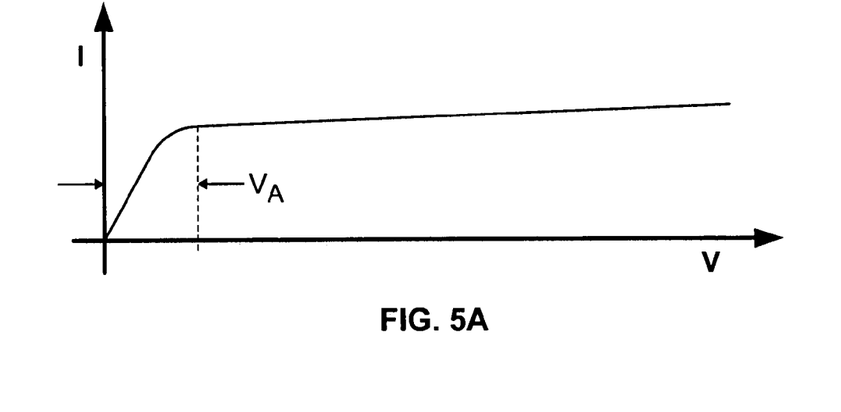
FIGS. 5a and 5b are further simplified circuit performance diagrams that are useful in the same way as FIG. 4.
Figure 5B:
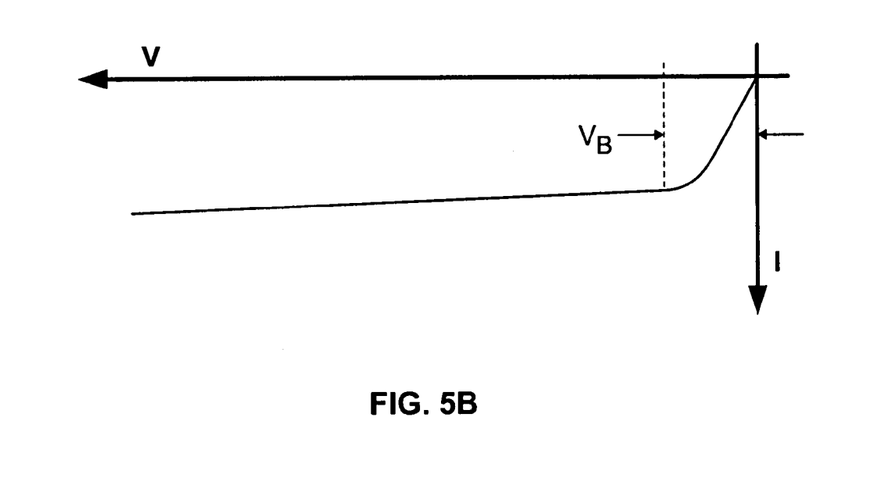

An "ideal" current source supplies constant current for any voltage across its terminal (see FIG. 4). A "good" current source is one having an IV (current/voltage) characteristic as close as possible to an ideal current source. The minimum voltage across a current source at which current supply ceases to be constant is called headroom voltage (see FIGS. 5a and 5b). Thus in FIG. 5a VA is the headroom voltage for a real pull-down current source INMAIN, while in FIG. 5b VB is the headroom voltage for a real pull-up current source IPMAIN. Again, a "good" current source should have as small as possible headroom voltage and less variation in current supply across voltage beyond the headroom voltage.

Current source headroom voltage limits how high and how low output voltage level (i.e., how large output differential voltage VOUTP–VOUTN) can be.

Suppose a number N of current sources (INMAIN and IPMAIN) is used in FIG. 3. Then the highest level output possible is $$VOUT\_MAX = VDD - (headroom\ of\ IPMAIN)$$
$$= N * IPMAIN * R + VCM$$

(ignoring the voltage drop across transistors A/B). Similarly $$VOUT\_MIN = (headroom\ of\ INMAIN)$$
$$= VCM - N * INMAIN * R$$

(again ignoring the voltage drop across transistors C/D). Therefore, differential output, VOD, is $$VOD\_MAX = VOUT\_MAX - VOUT\_MIN$$
$$= VDD - [(headroom\ of\ INMAIN) +$$
$$(headroom\ of\ IPMAIN)]$$

This demonstrates that maintaining small current source headroom voltage maximizes VOD, and that this is even more important when power supply VDD is reduced.

Figure 6:
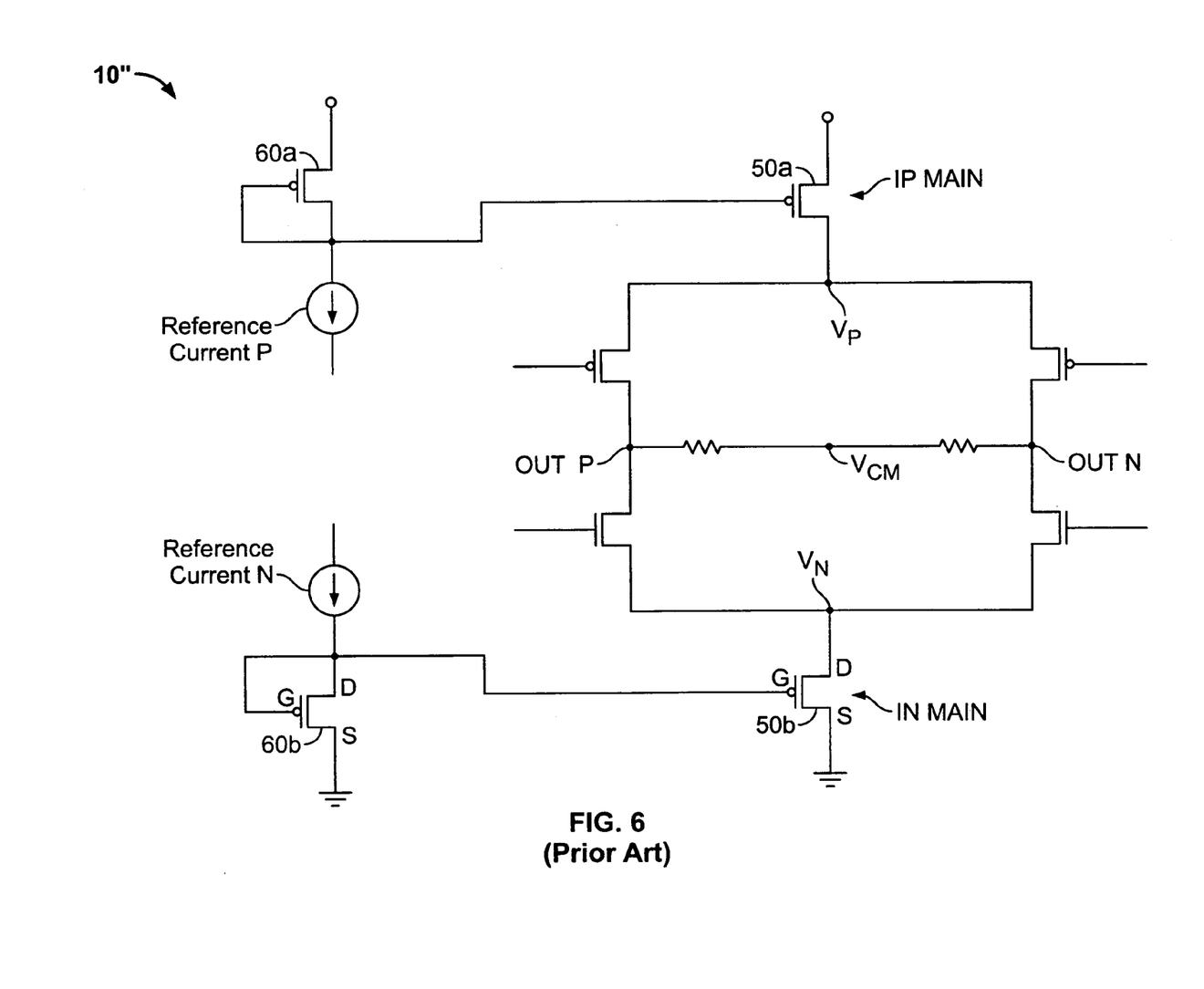
FIG. 6 is a simplified schematic block diagram showing certain known augmentation of circuitry of the type shown in FIG. 1.

FIG. 6 shows a known H-tree driver 10" that uses simple current mirroring to implement current sources. For example, PMOS transistor 60a and reference current P are connected in series between VDD and any suitable source of potential (voltage) below VDD (e.g., ground). The gate of IPMAIN transistor 50a is connected to the gate of transistor 60a and a node between that transistor and reference current P. Similarly, reference current N and transistor 60b are connected in series between a suitable source of potential (voltage) that is above ground (e.g., VDD) and ground. The gate of INMAIN transistor 50b is connected to the gate of transistor 60b and a node between that transistor and reference current N. The FIG. 6 design is functional for such processes as 90 nm minimum channel length, in which the typical Vtho for an N-channel MOS transistor is about 0.22V.

For smaller minimum-channel-length processes such as 65 nm, threshold voltage is set higher to combat leakage. Typical Vtho for 65 nm processes is about 0.38V for an N-channel MOS transistor. Using the same current source topology as FIG. 8, a higher gate-to-source Vgs voltage for diode device 60b is required for 65 nm to provide the same overdrive voltage (Vgs-Vt) as for 90 nm.

For diode connection 60b, gate-to-source voltage Vgs is the same as for drain-to-source (Vds) because the gate and drain of this transistor are connected together. As a result, the drain voltage of transistor 60b has to be higher due to higher threshold voltage Vt in order to maintain compatible overdrive voltage. For accurate current mirroring from device 60b to 50b, Vds of transistor 50b has to be compatible with Vds of device 60b. That means high Vds for device 60b results in high Vds for transistor 50b. As a result, current source headroom has increased, due to the higher threshold voltage Vt of the shorter minimum-channel-length process.

A second problem that can arise is that when multiple current source drivers such as transistor 50b are used (as in FIG. 3), VOD variation from target may happen due to a channel-length modulation effect.

Figure 7:
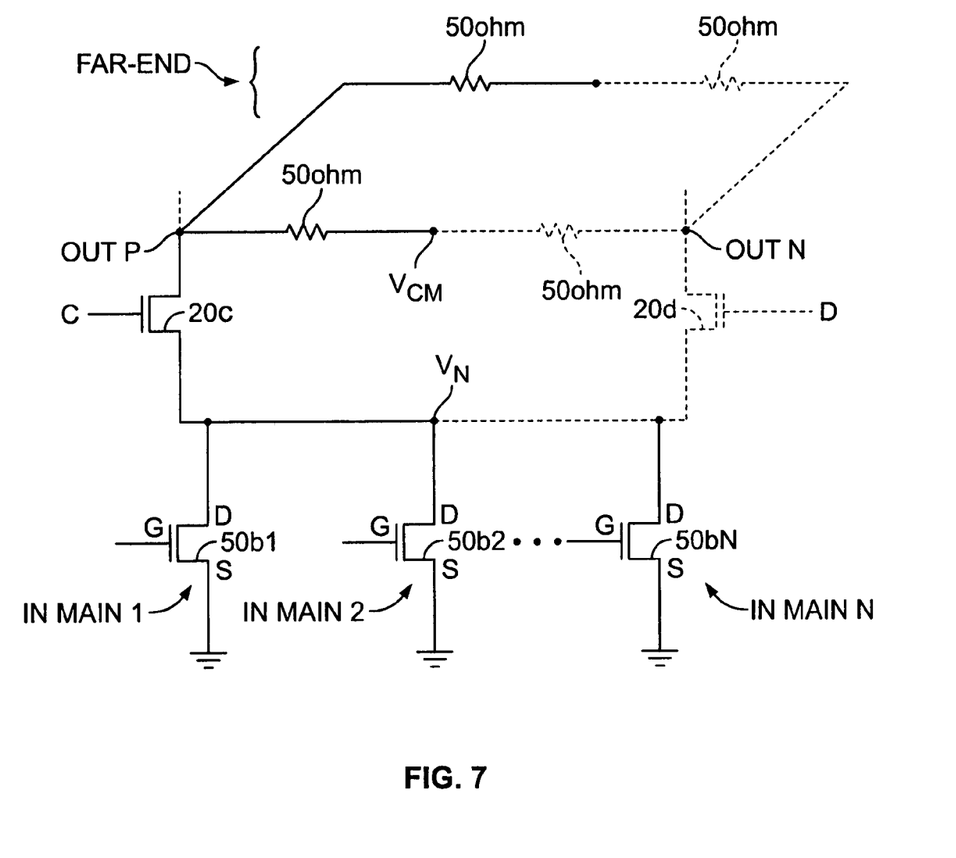
FIG. 7 is similar to a portion of FIG. 3 with additional remote circuit elements being shown in a known configuration.

Suppose that the H-tree driver in FIG. 3 has a 100 Ohm internal termination (R=50 Ohm), and another 100 Ohm far-end termination. FIG. 7 can be used to estimate the actual current amount at different VOD levels. (FIG. 7 omits the pull-up portion of the driver to avoid unnecessarily complicating the drawing.)

Figure 8:
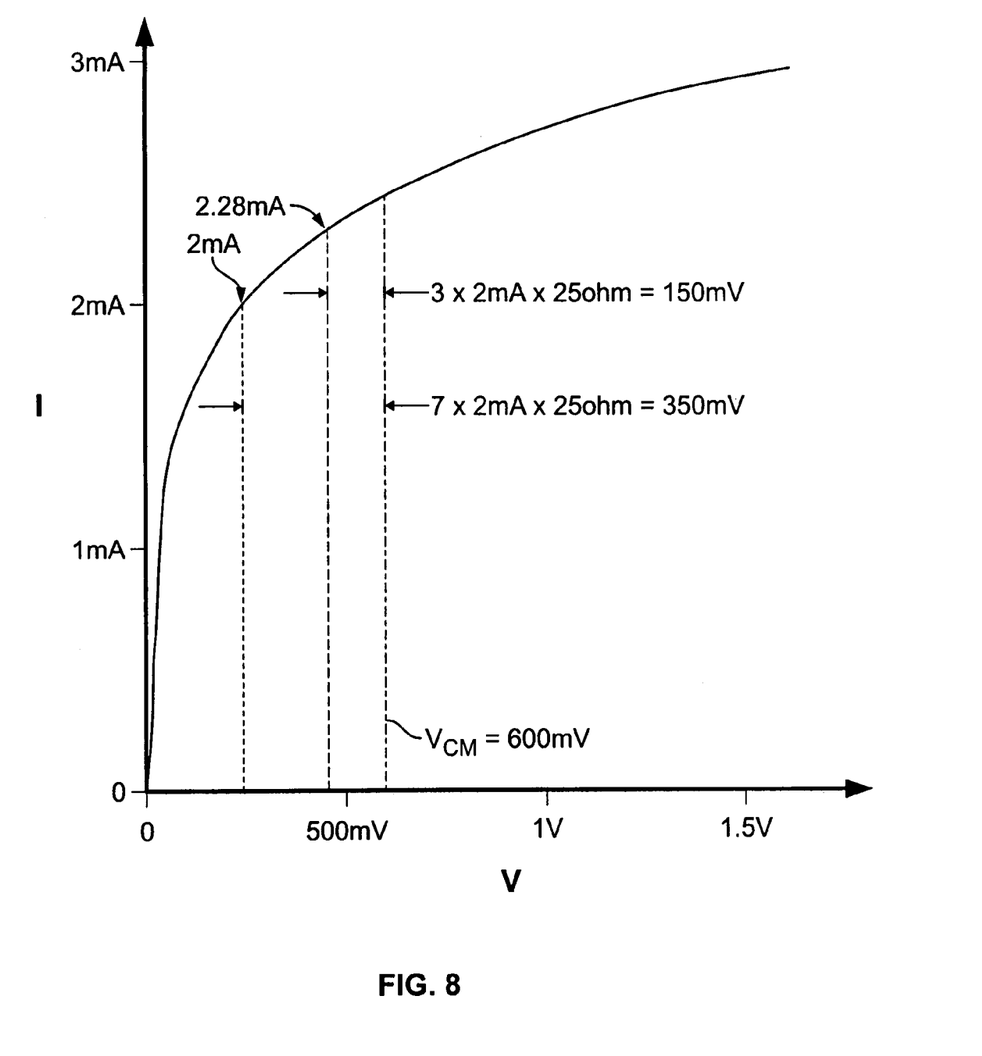
FIG. 8 is a simplified circuit performance curve that is useful in explaining certain underlying principles.

The IV curve for the current source implemented by transistors 50b1/50b2 . . . 50bN in FIG. 7 in a typical 90 nm process is shown in FIG. 8. Each current source is targeted to source 2 mA (INMAIN1=INMAIN2= . . . =INMAINN=2 mA). Clearly the FIG. 8 current source is far from ideal. The slope of the curve in the active region results in VOD variation at different VOD targets. Suppose VCM is 600 mV. Then if the voltage drop across switches like 20c is ignored, the voltage at node VN when N=7 (seven transistors 50b employed) is:

7*2 mA*25 Ohm=350 mV

For a 350 mV drop from VCM, following the left-most vertical line on FIG. 8 to map on to the current source IV curve, we arrive at roughly 2 mA, which is on target. However, if only three transistors 50b are used, the voltage at node VN is:

3*2 mA*25 Ohm=150 mV

Mapping that onto the FIG. 8 current source IV characteristic shows that the available current delivered is not 2 mA but 2.28 mA. This suggests that the actual VOD is larger than the target.

Figure 9:
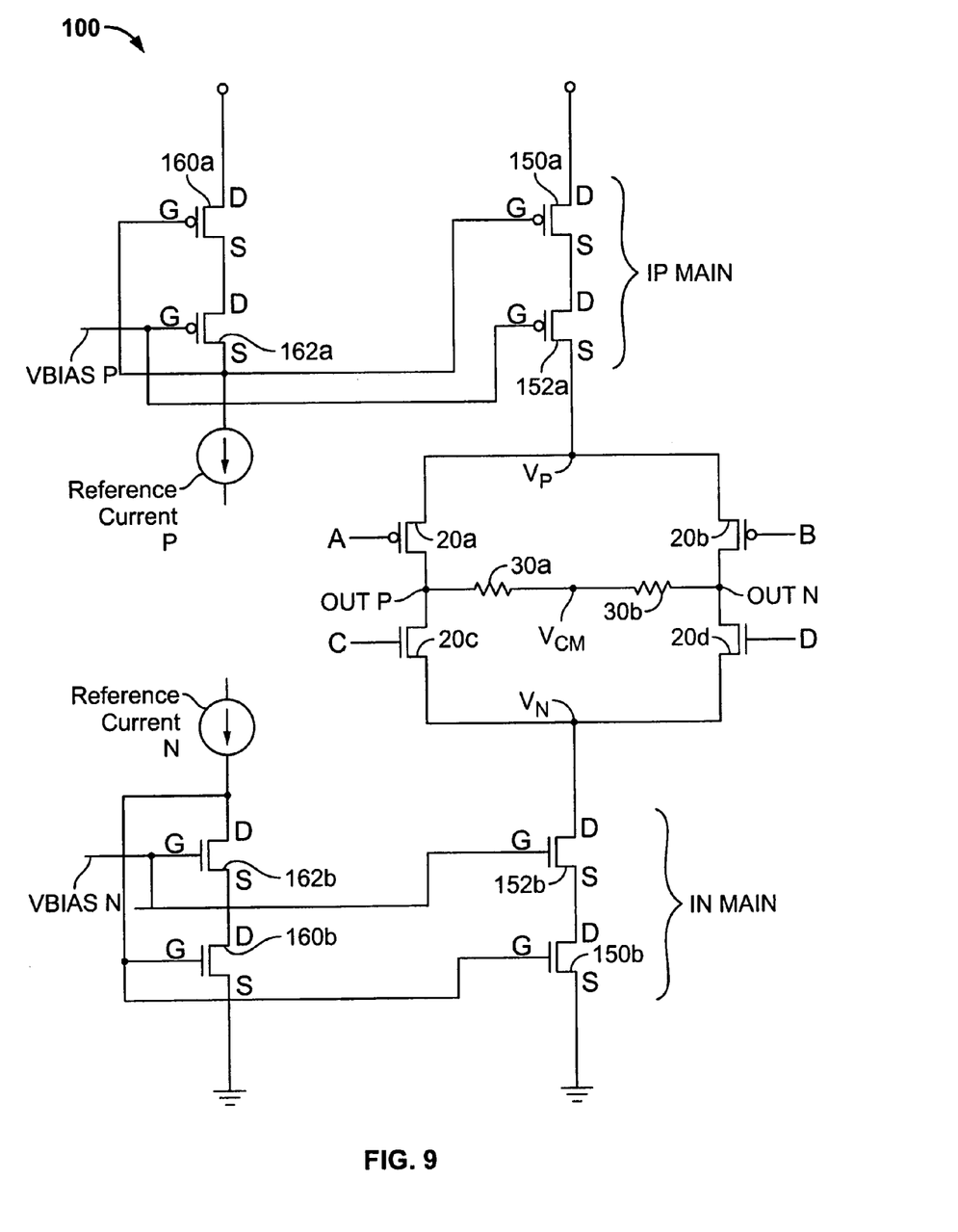
FIG. 9 is a simplified schematic block diagram of an illustrative embodiment of differential, H-tree driver circuitry in accordance with the invention.

In accordance with the present invention, the issues with the prior art that are identified above are addressed by using a low-voltage-cascode topology for the H-tree driver current sources as shown, for example in FIG. 9. The core of H-tree driver 100 (FIG. 9) can be the same as before and includes elements 20a-d and 30a-b. The current sources, however, now have a different construction than before. The pull-up current source includes PMOS transistors 150a and 152a connected in series between VDD and node VP. Ancillary to this IPMAIN circuitry, PMOS transistors 160a and 162a are connected in series between VDD and reference current P. The gates of transistors 150a and 160a are connected together and to a node between transistor 162a and reference current P. The gates of transistors 152a and 162a are connected together and to a source of bias voltage VBIASP. The pull-down current source includes NMOS transistors 152b and 150b connected in series between node VN and ground. Ancillary to this INMAIN circuitry, NMOS transistors 162b and 160b are connected in series between reference current N and ground. The gates of transistors 150b and 160b are connected together and to a node between reference current N and transistor 162b. The gates of transistors 1521b and 162b are connected together and to a source of bias voltage VBIASN.

VBIASN and VBIASP are bias voltages to the base of the common-gate (or the cascode device) in the low-voltage cascode current mirror. (P and N are complementary topologies.) The bias voltage level in each case (for example, VBIASN) is chosen along with device sizes such that both transistors in series (i.e., 162*b* and 160*b*/152*b* and 150*b*) all remain in saturation and consume minimum headroom (which is equal to the sum of the overdrive voltage of each device in the pair). The bias level can be a passive resistor divider to be invariant to temperature and process. Alternatively, the bias level could be a current source with a diode load which generates acceptable voltage variation that is still acceptable to low-voltage cascode current design. See, for example, Behzad Razavi, *Design of Analog CMOS Integrated Circuits*, Section 5.2.

Figure 10A:
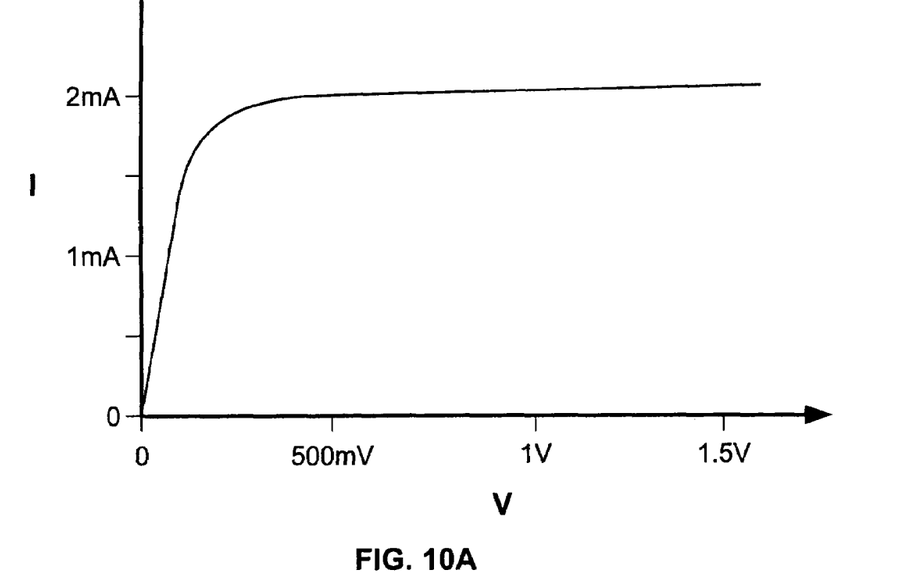
FIGS. 10a and 10b are simplified performance curves for certain aspects of the FIG. 9 circuitry.
Figure 10B:
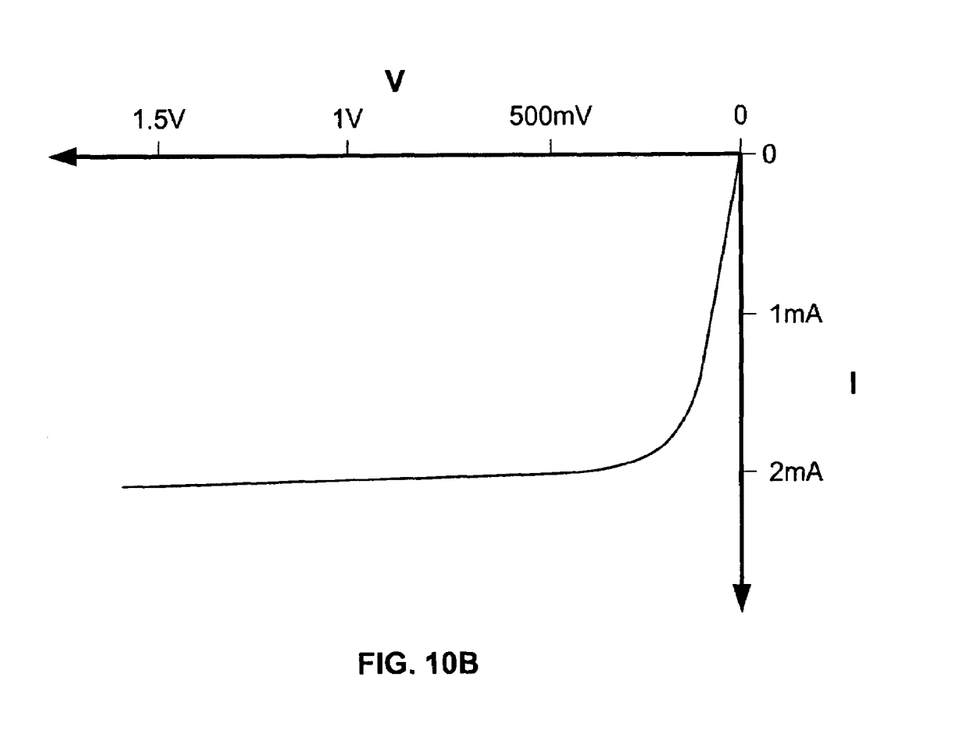

The current sources implemented by low-voltage cascode topology as in FIG. 9 can have low voltage headroom and high output impedance as shown in FIGS. 10*a* and 10*b*. It will be appreciated that the IV curves of FIGS. 10*a* and 10*b* are closer to the ideal current source characteristic than the IV curve in FIG. 8.

Current sources by low-voltage cascode implementation help to regain high differential voltage output (VOD) in the context of integrated circuit fabrication processes employing very small minimum channel length (e.g., 65 nm) and therefore higher threshold voltage. The prior art current source topologies cannot achieve comparably high VOD when such fabrication processes are employed. When an H-tree driver as shown in FIG. 9 drives a load as shown in FIG. 7 (again ignoring the drop across switches like 20), the maximum voltage drop of node VN from VCM is 350 mV for a typical largest pull-down current option of 14 mA. If the common-mode level is 600 mV, then node VN will be at around 250 mV, at which point the pull-down current source (see FIG. 10*a*) can still deliver target current close to 2 mA. Similarly, VP will be at 600 mV+350 mV=950 mV. From FIG. 10*b* the current amount required is 2 mA, which is on target.

Another benefit of the invention is that the active region of current sources in FIGS. 10*a* and 10*b* is more horizontal, like that of the ideal current source. From previous analysis, that will help reduce the VOD variation issue.

It will be understood that the foregoing is only illustrative of the principles of the invention, and that various modifications can be made by those skilled in the art without departing from the scope and spirit of the invention. For example, any number of pull-up current source networks like 150*a*, 152*a*, 160*a*, and 162*a*, etc., can be used in parallel in an H-tree driver in accordance with the invention. Similarly, any number of pull-down current source networks like 150*b*, 152*b*, 160*b*, and 162*b*, etc., can be used in parallel in an H-tree driver in accordance with the invention.

Figure 11:
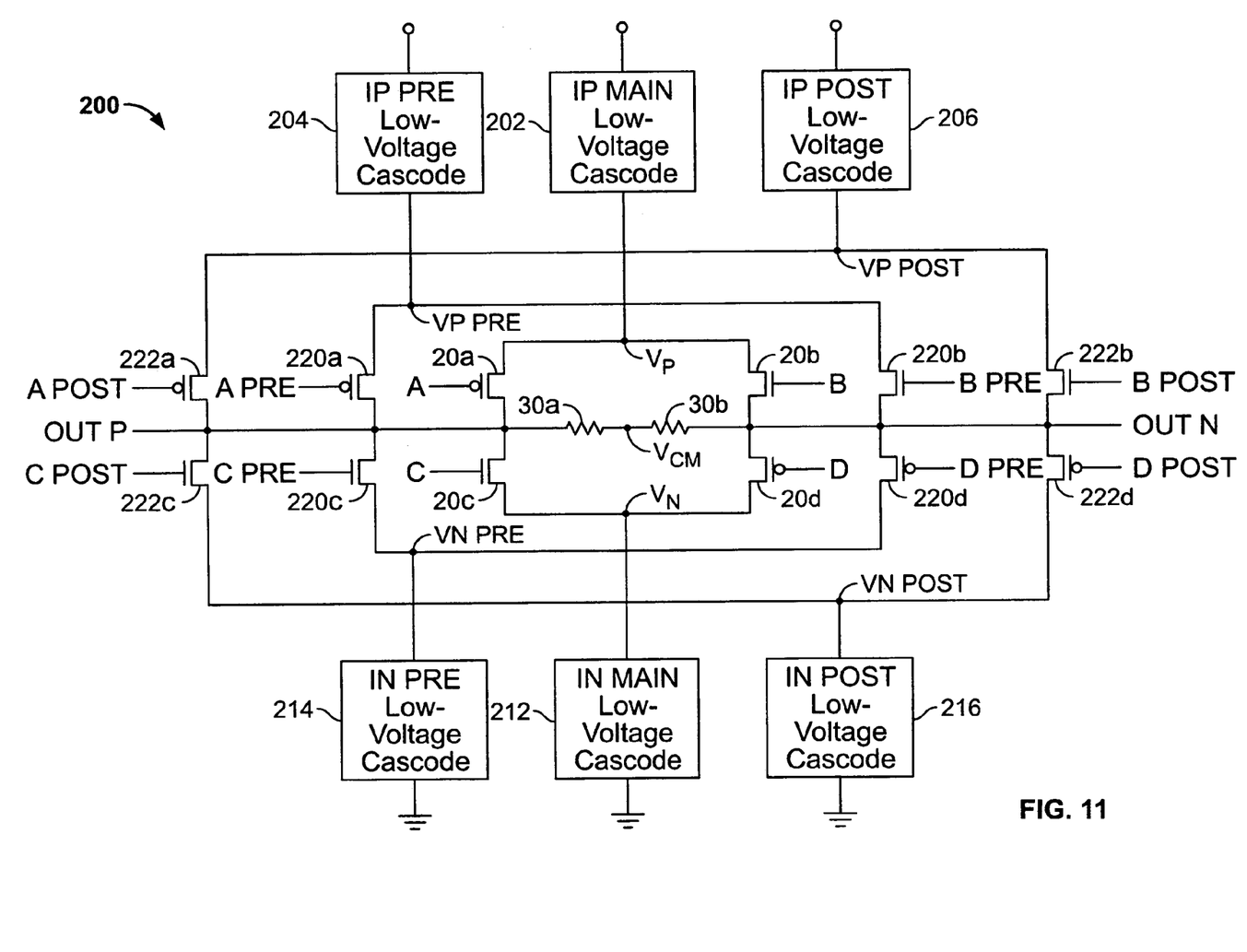
FIG. 11 is a simplified schematic block diagram of another illustrative embodiment of differential H-tree driver circuitry in accordance with the invention.

FIG. 11 shows extension of the principles of the invention to a multi-tap H-tree driver 200. In the illustrative embodiment shown in FIG. 11, elements 20*a-d*, 30*a-b*, 202, and 212 can be the same as what is shown in FIG. 9. In other words, element 202 in FIG. 11 can comprise FIG. 9 elements 150*a*, 152*a*, 160*a*, 162*a*, and reference current P, connected as shown in FIG. 9. Similarly, element 212 in FIG. 11 can comprise FIG. 9 elements 150*b*, 152*b*, 160*b*, 162*b*, and reference current N, connected as shown in FIG. 9.

In addition to the above-described basic circuitry, driver 200 can include two more instances of circuitry 202, shown as elements 204 and 206 in FIG. 11. Similarly, driver 200 can include two more instances of circuitry 212, shown as elements 214 and 216 in FIG. 11. PMOS transistor 220*a* and NMOS transistor 220*c* are connected in series between IPPRE 204 and INPRE 214. NMOS transistor 220*b* and PMOS transistor 220*d* are also connected in series between IPPRE 204 and INPRE 214. OUTP is connected to the node between transistors 220*a* and 220*c*. OUTN is connected to the node between transistors 220*b* and 220*d*. The gates of transistors 220*a-d* receives signals that are respectively like the signals applied to the gates of transistors 20*a-d*, except that the transistor 220*a-d* gate signals are advanced in phase relative to the transistor 20*a-d* gate signals. The circuitry that includes elements 204, 214, and 220*a-d* therefore comprises a so-called pre-tap stage of driver 200. (The much-earlier-described circuitry including elements 202, 212, and 20*a*-20*d* may be described as the main tap stage of driver 200.)

Another instance of circuitry like the above-mentioned pre-tap circuitry is also connected in parallel with the pre-tap and main tap circuitry. This further instance of this circuitry is so-called post-tap circuitry, which comprises elements 206, 216, and 222*a-d*. The gates of the transistors 222*a-d* in this post-tap circuitry again receive signals like those applied to the gates of transistors 20*a-d*, except that the post-tap signals (APOST-DPOST) are delayed in phase relative to the main tap signals (A-D).

Pre- and/or post-tap circuitry like that described above can be used to give the output signal of driver 200 what is sometimes called pre-emphasis. Pre-emphasis can be extra energy just before and/or just after each transition in the final output signal (OUTP-OUTN). See, for example, Shumarayev U.S. patent application Ser. No. 11/641,990, filed Dec. 18, 2006.

In accordance with the present invention, each tap of multi-tap output driver 200 can have the same type of current sources as are described earlier in this specification for the main tap (e.g., as in FIG. 9). Each of these pre- and/or post-tap current sources (i.e., 204, 206, 214, 216, and more such, if desired) can be low-voltage cascode current sources like the main tap current sources shown in detail in FIG. 9 and shown abstracted as elements 202 and 212 in FIG. 11.

The invention claimed is:

1. Differential output driver circuitry comprising:
   a pull-up current source connected between a power supply voltage source and a first node;
   a pull-down current source connected between a second node and ground;
   first and second transistors connected in series between the first and second nodes;
   third and fourth transistors connected in series between the first and second nodes;
   a first output node connected between the first and second transistors;
   a second output node connected between the third and fourth transistors;
   first and second resistors connected in series between the first and second output nodes; and
   a common-mode voltage source connected between the first and second resistors, wherein the pull-up current source comprises:
   fifth and sixth transistors connected in series between the power supply voltage source and the first node;
   seventh and eighth transistors connected in series between the power supply voltage source and a first reference current source;
   a first connection that connects together a gate terminal of the seventh transistor, a source terminal of the eighth transistor, and a gate terminal of the fifth transistor; and
   a second connection that connects together a first bias voltage source, a gate terminal of the eighth transistor, and a gate terminal of the sixth transistor.

2. The circuitry defined in claim 1 wherein the pull-down current source comprises:
   ninth and tenth transistors connected in series between the second node and ground;
   eleventh and twelfth transistors connected in series between a second reference current source and ground;

a third connection between a drain terminal of the eleventh transistor, a gate terminal of the twelfth transistor, and a gate terminal of the tenth transistor; and a fourth connection between a second bias voltage source, a gate terminal of the eleventh transistor, and a gate terminal of the ninth transistor.

3. The circuitry defined in claim 1 wherein the pull-up current source is one instance of a plurality of pull-up current sources that are connected in parallel between the power supply voltage source and the first node, each of the pull-up current sources being constructed as specified in claim 1 for the pull-up current source.

4. The circuit defined in claim 2 wherein the pull-down current source is one instance of a plurality of pull-down current sources that are connected in parallel between the second node and ground, each of the pull-down current sources begin constructed as specified in claim 2 for the pull-down current source.

5. Differential output driver circuitry comprising:
(a) first and second transistors connected in series between a power supply voltage source and a first node;
(b) third and fourth transistors connected in series between the power supply voltage source and a first reference current;
(c) a first connection between gate terminals of the first and third transistors and a source terminal of the fourth transistor;
(d) a second connection between gate terminals of the second and fourth transistors and a first bias voltage source;
(e) fifth and sixth transistors connected in series between a second node and ground;
(f) seventh and eighth transistors connected in series between a second reference current source and ground;
(g) a third connection between gate terminals of the sixth and eighth transistors and a drain terminal of the seventh transistor;
(h) a fourth connection between gate terminals of the fifth and seventh transistors and a second bias voltage source;
(i) ninth and tenth transistors connected in series between the first and second nodes;
(j) eleventh and twelfth transistors connected in series between the first and second nodes;
(k) a first output node connected between the ninth and tenth transistors;
(l) a second output node connected between the eleventh and twelfth transistors;
(m) first and second resistors connected between the first and second output nodes; and
(n) a common mode voltage source connected between the first and second resistors.

6. The circuitry; defined in claim 5 further comprising connections to gates of the ninth through twelfth transistors for applying a signal to be output by the driver circuitry to those transistors.

7. The circuitry defined in claim 6 further comprising:
a second instance of elements (a)-(j), with the first output node being connected between the ninth and tenth transistors of the second instance, and with the second output node being connected between the eleventh and twelfth transistors of the second instance.

8. The circuitry defined in claim 7 further comprising connections to gates of the ninth through twelfth transistors of the second instance for applying to those transistors a phase-shifted version of the signal to be output by the driver circuitry.

9. The circuitry defined in claim 8 wherein the phase-shifted version is delayed relative to the signal to be output by the driver circuitry.

10. The circuitry defined in claim 8 wherein the phase-shifted version is advanced relative to the signal to be output by the driver circuitry.

11. The circuitry-defined in claim 9 further comprising:
a third instance of elements (a)-(j),
with the first output node being connected between the ninth and tenth transistors of the third instance, and with the second output node being connected between the eleventh and twelfth transistors of the third instance.

12. The circuitry defined in claim 11 further comprising connections to gates of the ninth through twelfth transistors of the third instance for applying to those transistors a further phase-shifted version of the signal to be output by the driver circuitry.

13. The circuitry defined in claim 12
wherein the further phase-shifted version is advanced relative to the signal to be output by the driver circuitry.

14. Differential output driver circuitry comprising:
a plurality of pull-up current sources connected in parallel with one another between a source of relatively high voltage and a first node;
a plurality of pull-down current sources connected in parallel with one another between a second node and a source of relatively low voltage;
first and second transistors connected in series between the first and second nodes;
third and fourth transistors connected in series between the first and second nodes;
a first output node connected between the first and second transistors;
a second output node connected between the third and fourth transistors;
first and second resistors connected in series between the first and second output nodes; and
a common mode voltage source connected between the first and second resistors, wherein each of the pull-up current sources comprises:
fifth and sixth transistors connected in series between the source of relatively high voltage and the first node;
seventh and eighth transistors connected in series between the source of relatively high voltage and a first reference current;
a first connection between gate terminals of the firth and seventh transistors and a source terminal of the eighth transistor; and
a second connection between gate terminals of the sixth and eighth transistors and a first bias voltage source.

15. The circuitry defined in claim 14
wherein each of the pull-down current sources comprises:
ninth and tenth transistors connected in series between the second node and the source of relatively low voltage;
eleventh and twelfth transistors connected in series between a second reference current source and the source of relatively low voltage;
a third connection between gate terminals of the tenth and twelfth transistors and a drain terminal of the eleventh transistor; and
a fourth connection between gate terminals of the ninth and eleventh transistors and a second bias voltage source.

* * * * *